United States Patent [19]

Hillman

[11] Patent Number: 4,885,075
[45] Date of Patent: Dec. 5, 1989

[54] COOLING DEVICE FOR A SPUTTER TARGET AND SOURCE

[75] Inventor: Gary Hillman, Livingston, N.J.

[73] Assignee: Machine Technology, Inc., Parsippany, N.J.

[21] Appl. No.: 290,882

[22] Filed: Dec. 22, 1988

Related U.S. Application Data

[63] Continuation of Ser. No. 7,743, Jan. 27, 1987, abandoned.

[51] Int. Cl.[4] .............................................. C23C 14/34
[52] U.S. Cl. .................................. 204/298; 204/192.12
[58] Field of Search ......... 204/192.1, 192.12, 298 CS, 204/298 TS, 298 WH

[56] References Cited

U.S. PATENT DOCUMENTS

| 3,718,572 | 2/1973 | Robinson et al. | 204/298 |
| 3,741,886 | 6/1973 | Urbanek et al. | 204/298 |
| 4,204,936 | 5/1980 | Hartsough | 204/298 |
| 4,517,070 | 5/1985 | Kisner | 204/298 |
| 4,668,373 | 5/1987 | Rille et al. | 204/298 |

FOREIGN PATENT DOCUMENTS

| 3030329 | 2/1982 | Fed. Rep. of Germany | 204/298 |
| 53-37588 | 4/1978 | Japan . | |
| 5917984 | 4/1978 | Japan . | |
| 2173117 | 10/1986 | United Kingdom . | |

Primary Examiner—Nam X. Nguyen
Attorney, Agent, or Firm—Lerner, David, Littenberg, Krumholz & Mentlik

[57] ABSTRACT

A device for cooling a sputter target of a deposition apparatus utilizes an annular shaped member of high thermal conductivity disposed between the cathode and the target electrode. The member is constructed of a base disposed in a corresponding recess in the cathode, or integrally formed therewith, and a member projecting perpendicularly from the base disposed in a corresponding annular shaped recess in the target electrode. One or more members are disposed proximate a source of cooling water applied to the cathode, and at points of greatest power flux in the target electrode. Upon heating, the target electrode expands radially against the members, thereby effecting reduction in the temperature of the target electrode.

36 Claims, 7 Drawing Sheets

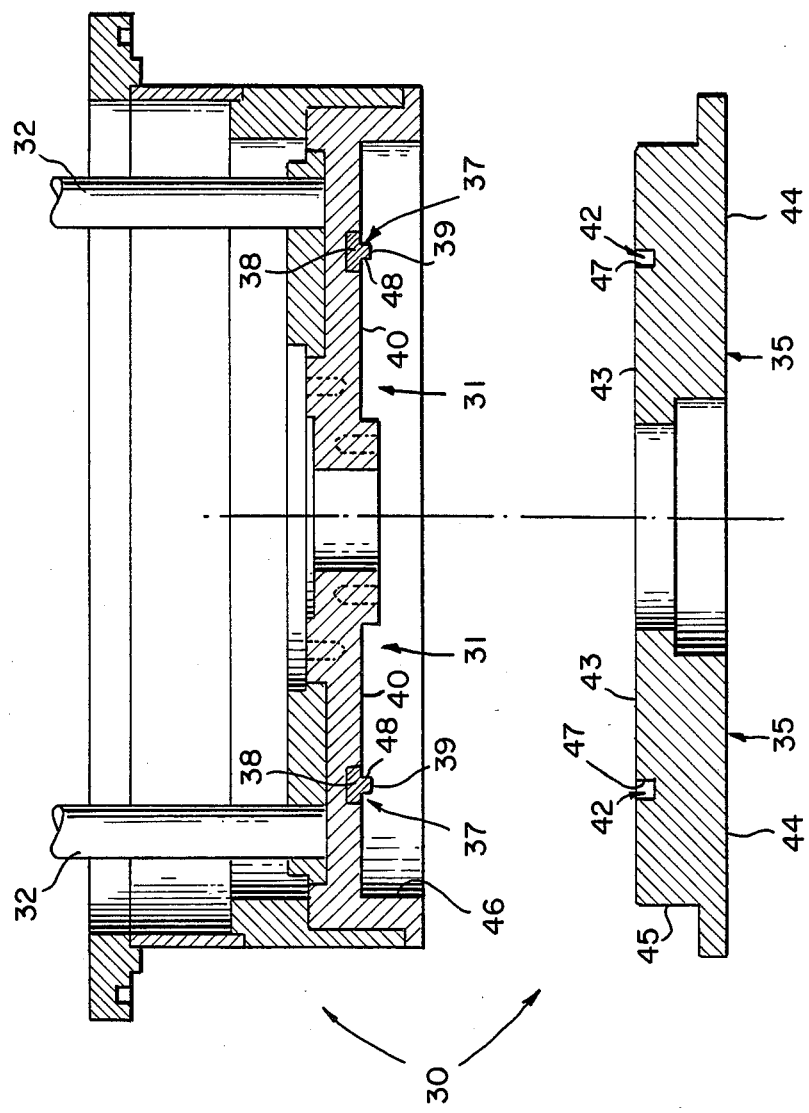

COOLING DEVICE FOR A SPUTTER TARGET AND SOURCE

This is a continuation, of application Ser. No. 07/007,743 filed Jan. 27, 1987, abandoned.

FIELD OF THE INVENTION

The present invention relates generally to a vacuum deposition apparatus for coating substrates with a variety of film compositions, and more particularly, to a cooling device for a sputter target and source, i.e., cathode and target electrode assembly having enhanced cooling capability and sputtering characteristics.

BACKGROUND OF THE INVENTION

Referring to FIG. 1A, a deposition apparatus in accordance with the prior art for depositing a thin film layer to a surface of a workpiece, such as a semiconductor wafer is depicted. The apparatus is constructed of a combined cathode and target electrode assembly, including a cooling mechanism (not shown), which are generally designated by reference numeral 70. A power supply 71 is coupled to the assembly 70 for applying a high voltage thereto. A workpiece 72, such as a semiconductor wafer having a generally circular configuration, is placed on a mounting mechanism generally designated by reference numeral 75, which may rotate the workpiece 72 relative to the assembly 70. When voltage is applied to the assembly 70, deposition of a thin film layer from the target electrode occurs on the exposed surface of the workpiece 72. A housing 77, wherein a vacuum is maintained, contains the assembly 70, the workpiece 72, and the mounting mechanism 75.

Referring to FIG. 1B, a portion of the cathode and target electrode assembly of the prior art is depicted in detail. A circular target electrode 11, as a source of material to be sputtered, is disposed adjacent a circular cathode 12. For assembly purposes, a slight gap exists between the cathode 12 and the target electrode 11 at a planar surface 22 of the target electrode, when the target electrode is cool. Pipes 13 are utilized to convey water or other cooling fluid to a chamber 20 provided adjacent the surface of the cathode 12, for cooling the cathode and primarily the target electrode 11. During the sputtering process, heat is generated at a surface 11A of the target electrode 11. In response, the target electrode 11 expands radially outward, pressing against a surface 15 of the cathode 12. Accordingly, cooling of the target electrode 11 by the water in the chamber 20 is effected primarily through the surface 15 of the cathode 12. Owing to the radial expansion of the target electrode 11 upon heating, the fit of the target electrode 11 and the cathode 12 at the surface 22 of the target electrode remains relatively loose, providing inefficient cooling of the target electrode 11 thereat.

Further, with radial expansion of the target electrode 11, contact of the target electrode 11 and the cathode 12 is reduced at a surface 25 of the cathode 12, limiting cooling therethrough. Thus, cooling of the target electrode 11 is afforded primarily via the surface 15 of the cathode 12. With heating occurring at the surface 11A of the target electrode 11, significant temperature differentials occur throughout the target material, across the gap at the surface 22 to the water cooled cathode 12, and through the cathode 12 itself.

At a power flux of about 160W/cm$^2$ typically flowing across the surface 15 of the cathode 12, a temperature differential of approximately 100° C. can exist. Owing to the length of the path through the cathode 12 from the surface 15 to the chamber 20, an additional drop of about 80° C. can also exist. Assuming a reasonable flow and temperature of the cooling water inlet via the pipes 13, the coolest portion of the target electrode 11 at the surface 15 of the cathode 12 is generally at a temperature of at least 230° C. From the surface 15 of the cathode 12 to the surface 11A of the target electrode 11 there can be a temperature rise in the case of aluminum alloys of an additional 250° C., which is approximately the melting point of some eutectics which may be present in the target material. The generation of such high temperatures in the target electrode 11, particularly at the surface 11A, results in an unacceptable lack of control of the deposition process which can produce a runaway voltage at high power.

One known cathode and target electrode assembly which overcomes the above mentioned cooling problem incorporates a target electrode which is soldered directly within the hollow of the cathode to provide a unitary construction. This assembly, however, suffers from a number of notable drawbacks which results from this construction. The most significant one is the inability of this assembly to permit replacement of the target electrode in a simple and economical manner. For example, it is required that all remanents of the target electrode be completely machined from within the cathode hollow prior to soldering a replacement target electrode.

Accordingly, there is a need for a simple, efficacious means of cooling the target electrode 11 of such a deposition apparatus.

SUMMARY OF THE INVENTION

The present invention entails a cooling device for the target electrode of a deposition apparatus.

More particularly, in accordance with one embodiment of the present invention, there is described and disclosed an assembly for use in a deposition apparatus, comprising a source of material to be deposited having a surface, an electrode having a surface disposed adjacent the surface of the source, and coupling means disposed between the electrode and the source and extending within one of said surfaces for increasing the thermal coupling therebetween.

In accordance with this embodiment of the present invention, the coupling means is constructed of an annular member disposed between the cathode and the target electrode. The annular member comprises an insert having a base and a portion projecting from the base. The base is disposed in an annular recess in the cathode, and the portion projecting from the base is disposed in a corresponding annular recess in the target electrode. Preferably, the annular member comprises copper, and the clearance between the annular member and the recess in the electrode is between 0.003 and 0.005 inches when the electrode is cool. More preferably, the projecting portion is integrally formed with the cathode or target electrode so as to eliminate the aforementioned base and the insert nature of the annular member.

Upon heating of the target electrode, the electrode expands radially outward, pressing against the projection of the annular member. In this fashion, the annular member serves to dissipate additional heat from the target electrode. The annular member may be situated at a location of maximum heat concentration in the target electrode.

In another embodiment of the present invention, a plurality of concentric annular members are disposed between the cathode and the target electrode. Each of the members when constructed as an insert comprises a base disposed in a corresponding annular recess in the cathode, and a portion projecting from the base disposed in a corresponding annular recess in the target electrode.

Upon heating of the target electrode, the electrode expands radially outward, pressing against each of the annular members. In this fashion, each of the annular members dissipate heat engendered in the electrode. The annular members may be positioned according to the heat distribution in the target electrode. Further, the dimensions of the base and the portion projecting from the base of each annular member may be adjusted to accommodate the heat accumulation at a particular location. Preferably, the annular members comprise copper, and the clearance between each annular member and the corresponding recess in the electrode is between 0.003 and 0.005 inches when the electrode is cool.

In another embodiment of the present invention, the heat-dissipating member disposed between the cathode and the target electrode comprises segments of an annulus. Each of these segments when constructed as an insert possesses a base and a portion projecting therefrom. Each base is disposed in a corresponding recess in the cathode; and each portion projecting from a base is disposed in a corresponding recess in the target electrode.

In operation, as the temperature of the target electrode rises, it expands radially outward pressing against each segment, thereby dissipating the heat in the target electrode.

More generally, the present invention entails the use of a member disposed between and in contact with the cathode and the target electrode so as to dissipate additional heat from the target electrode. That is, the member increases thermal coupling of the cathode and the target electrode. The member may be formed as an insert or integrally formed within the cathode or target electrode. Preferably, the member is disposed proximate to the cooling water so as to enhance the efficiency of its heat dissipation. Further, the member is configured such that upon expansion of the target electrode owing to heating thereof, the target electrode presses against the member. Any number of members may be utilized in accordance with the heat distribution of the target electrode. The configuration of each member may be altered to accommodate the heat accumulation at a particular point. For example, a member having a larger surface projecting into the target electrode may be employed at a point on the electrode having a high temperature.

The present invention entails several advantages. The target electrode may be more efficiently cooled by positioning the heat-dissipating members proximate to the flow of cooling water. In the prior art, the side wall of the cathode, which is responsible for most of the heat conduction, is located relatively remote from the flow of cooling water. Thus, the present invention permits further exploitation of the cooling water, resulting in greater cooling efficiency. Unlike the prior art, the present invention permits selective positioning and modification of the heat-dissipating members to accommodate the distribution of heat in the target electrode. Different points of the target electrode exhibit different temperatures. The members may be positioned at concentrations of heat, and the dimensions of these members may be adjusted to accommodate such concentrations. As such, temperature differentials at all points in the target may be reduced, extending the life of the target electrode. The present invention permits material to be utilized for a target electrode which exhibits sensitivity to temperature differentials; since, such differentials are efficiently reduced via the heat-dissipating members of the present invention.

BRIEF DESCRIPTION OF THE DRAWINGS

The above description, as well as further objects, features and advantages of the present invention will be more fully understood by reference to the following detailed description of the presently preferred, but nonetheless illustrative, cooling device for a sputter target and source in accordance with the present invention, when taken in conjunction with the accompanying drawings, wherein:

FIG. 2 is an exploded, sectional view of a cathode and target electrode assembly in accordance with one embodiment of the present invention.

DESCRIPTION OF THE PREFERRED EMBODIMENTS

Figure 1A:
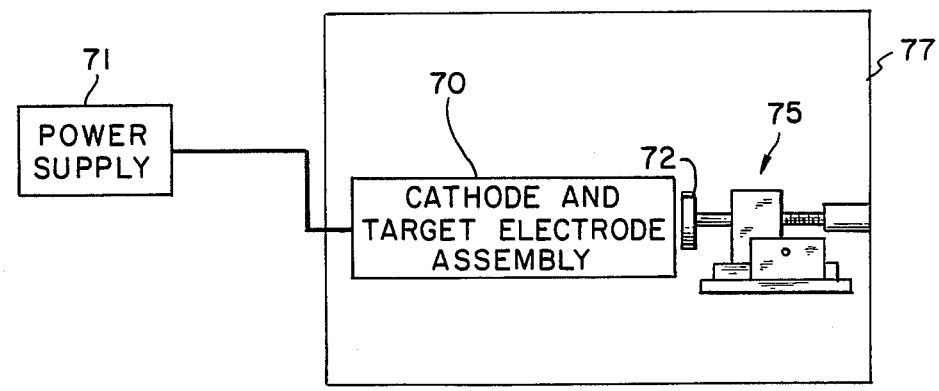
FIG. 1A is a schematic diagram of a deposition apparatus according to the prior art.
Figure 1B:
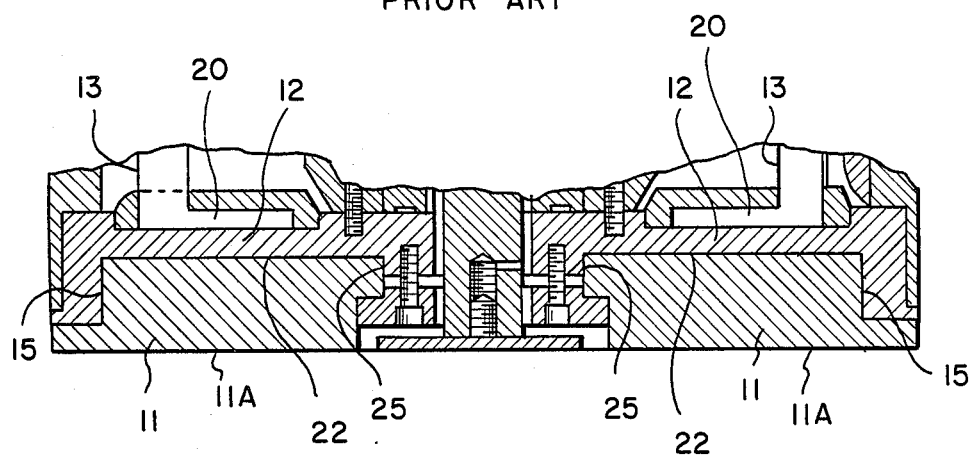
FIG. 1B is a fragmentary, sectional view of a portion of a cathode and target electrode assembly of the deposition apparatus of FIG. 1A.
Figure 3:
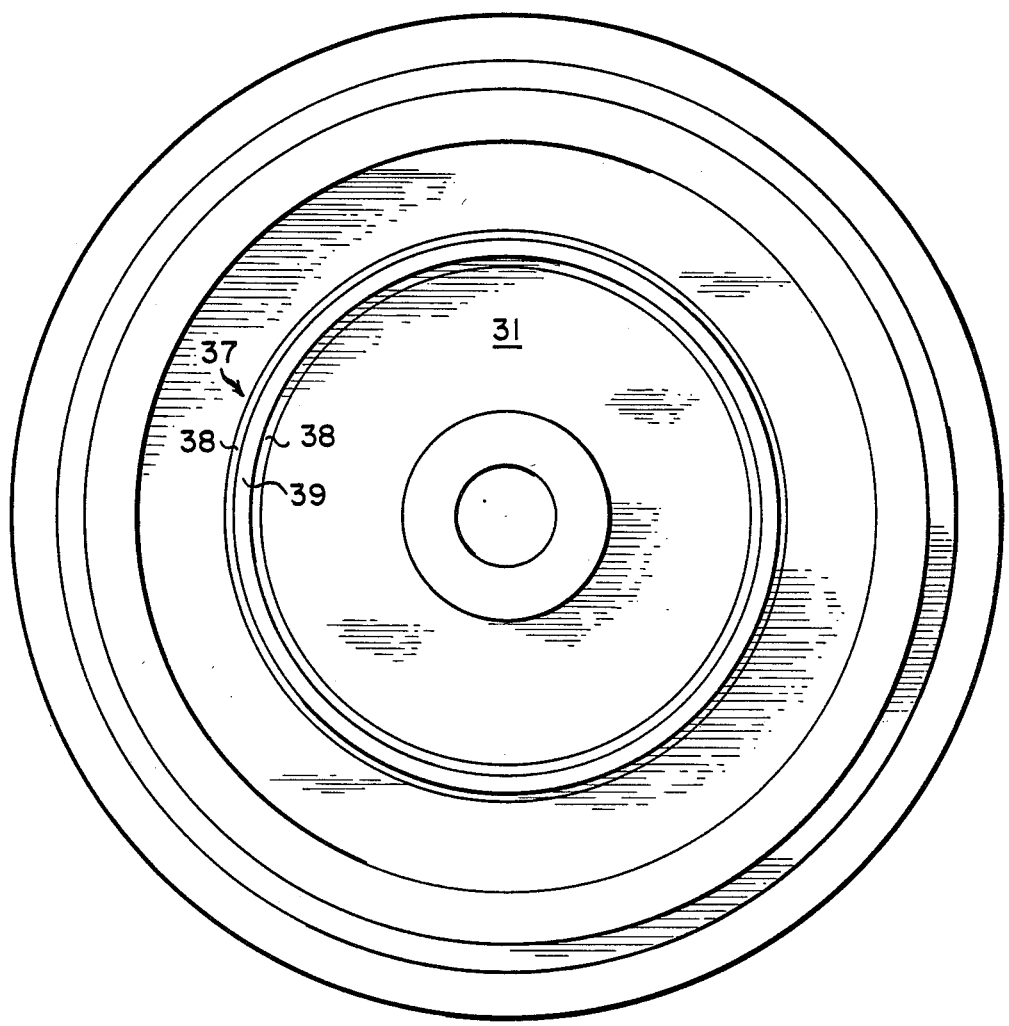
FIG. 3 is a bottom plan view of the cathode portion of the assembly depicted in FIG. 2.

The present invention entails a cooling device for the target electrode of a deposition apparatus. Referring to FIGS. 2 and 3, an assembly generally designated by reference numeral 30 includes a circular cathode 31 having a hollow, and pipes 32 utilized to conduct water to the surface of the cathode 31 for cooling purposes. A circular target electrode 35, which in accordance with one application comprises aluminum to be deposited in a thin film layer, is shown separated from the cathode 31. In operation, the target electrode 35 is inserted into the hollow of the cathode 31 and in contact therewith, as depicted in FIG. 1B. An annular member 37 having a base 38 and a projecting portion or member 39 extending perpendicularly from the base 38 is disposed in an annular recess provided in a surface 40 of the cathode 31. Preferably, the annular member 37 comprises copper or other such material having good thermal conductivity. An annular recess 42 is disposed in a surface 43 of the target electrode 35. The recess 42 is adapted to engage the portion 39 of the annular member 37. Preferably there is a radial clearance between the target electrode 35 and the portion 39 of the member 37 of approximately 0.003 to 0.005 inches, when the electrode 35 is cool. With the target electrode 35 and the cathode 31 assembled as in FIG. 1B, the annular member 37 projects from the surface 40 of the cathode 31 into the annular recess 42 of the electrode 35.

In operation, when the surface 44 of the target electrode 35 is heated, the target electrode 35 expands radially outward, pressing a surface 45 against a surface 46 of the cathode 31, and a surface 47 of the annular recess 42 against a surface 48 of the projecting portion 39 of the annular member 37. In this fashion, the annular member 37 provides additional cooling of the target electrode 35, particularly through the additional contact surface 48 of the annular member 37. The annular member 37 may be disposed proximate the cooling water provided by the pipes 32, to enhance the cooling effect upon the target electrode 35 by minimizing the path therebetween. The annular member 37 may be disposed considerably more closely to the cooling water provided by the pipes 32 than the surface 46 of the cathode 31. Accordingly, the annular member 37 provides a more efficient means of cooling the target electrode 35 than the surface 46 of the cathode 31. Further, the dimensions of the annular member 37 may be varied to suit the needs of the occasion. Specifically, the base 38 of the member 37, or the surface 48 of the annular member 37 may be enlarged to increase the capacity of the annular member 37 to drain heat from the target electrode 35.

Further, it is generally an operating condition that the power flux varies across the eroding surface 44 of the electrode 35. Accordingly, the annular member 37 may be positioned at a point of maximum power flux to prevent an excessive accumulation of heat thereat.

Figure 4:
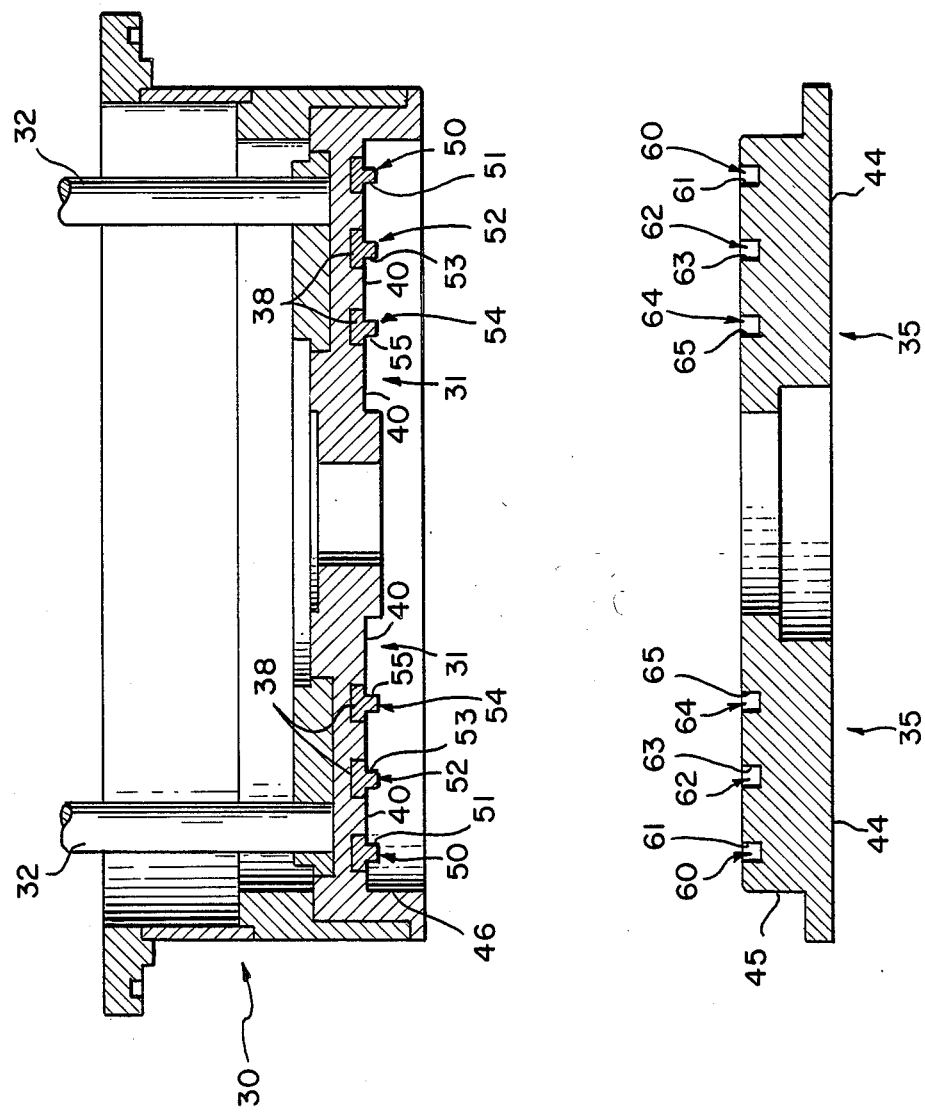
FIG. 4 is an exploded, sectional view of a cathode and target electrode assembly in accordance with another embodiment of the present invention.
Figure 5:
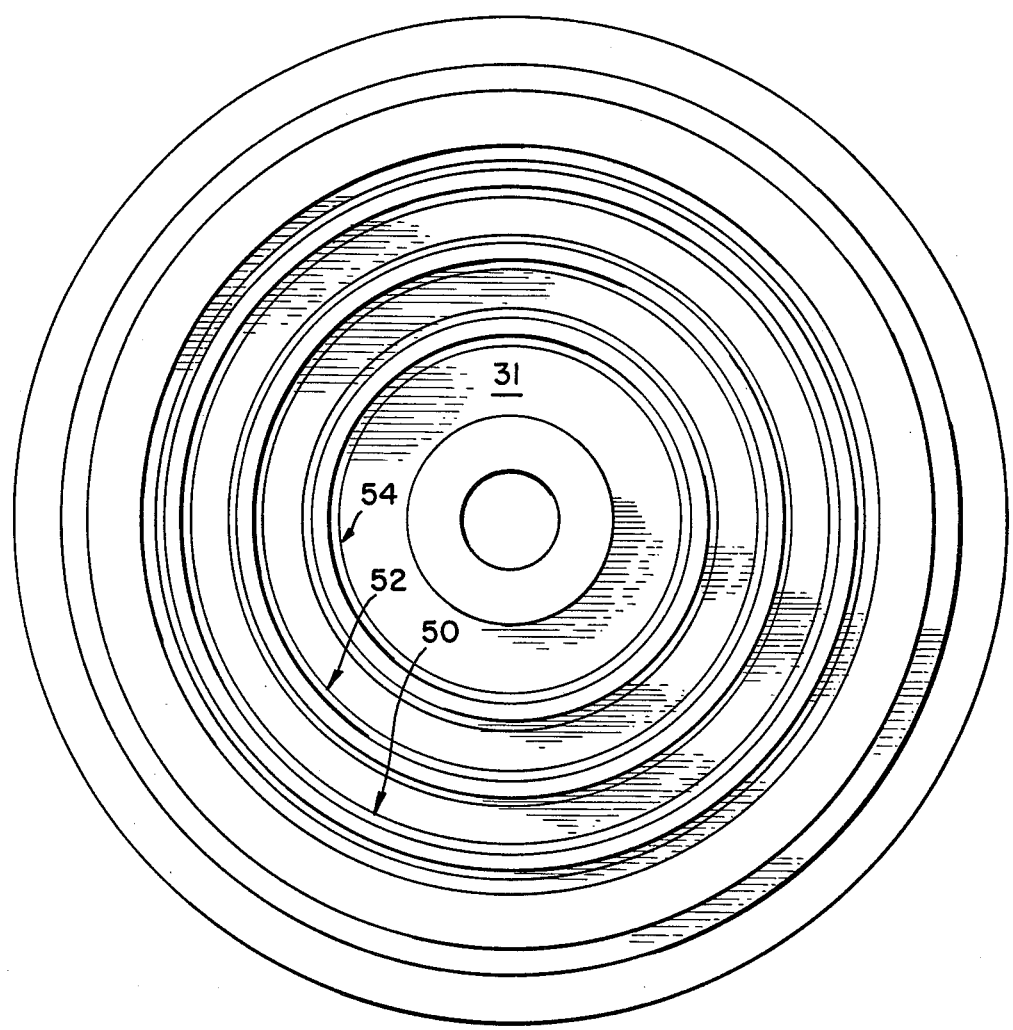
FIG. 5 is a bottom plan view of the cathode portion of the assembly depicted in FIG. 4.

Referring to FIGS. 4 and 5, a second embodiment of the present invention is depicted entailing annular members 50, 52, and 54 which are similar to annular member 37 of FIGS. 2 and 3. The bases of the annular members 50, 52, and 54 are disposed, respectively, in annular recesses provided in the surface 40 of the cathode 31. A portion of each of the annular members 50, 52, and 54 projects from the base thereof. Annular recesses 60, 62, and 64 in the target electrode 35 are adapted to receive, respectively, the projecting portions of the annular members 50, 52, and 54. Preferably, the annular members 50, 52, and 54 comprise copper as previously noted.

In operation, the target electrode 35 is inserted into the hollow of the cathode 31 with the annular members 50, 52, and 54 disposed in, respectively, the annular recesses 60, 62, and 64 of the target electrode 35. As the temperature of the surface 44 of the target electrode 35 rises, the target electrode 35 expands radially outward. As a result, a surface 61 of the annular recess 60 presses against a surface 51 of the annular member 50. Similarly, a surface 63 of the annular recess 62 presses against a surface 53 of the annular member 52; and, a surface 65 of the annular recess 64 presses against a surface 55 of the annular member 54. In this fashion, the cooling of the target electrode 35 is enhanced via contact of the target electrode 35 with the additional cooling surfaces of the annular members 50, 52, and 54. Since the annular members 50, 52, and 54 are disposed more closely than the surface 46 of the cathode 31 to the cooling water provided by the pipes 32, the cooling effect afforded by the annular members 50, 52, and 54 is more efficient in nature.

As the power flux can vary across the eroding surface 44 of the target electrode 35, there is engendered a nonuniform temperature distribution thereon. Accordingly, the annular members 50, 52, and 54 may be placed at positions of highest heat concentration, to most effectively dissipate it. Further, the dimensions of the base and portion extending therefrom of each of the annular members may be adjusted to suit a particular cooling situation. For example, the areas of the surfaces 51, 53, and 55 of, respectively, the annular members 50, 52, and 54 may be independently varied to accommodate temperatures occurring in particular positions. Preferably, the radial clearance between the projecting portions of the annular members 50, 52, and 54, and, respectively, the annular recesses 60, 62, and 64 is in the range 0.003 to 0.005 inches, when the target electrode 35 is cool.

Figure 6:
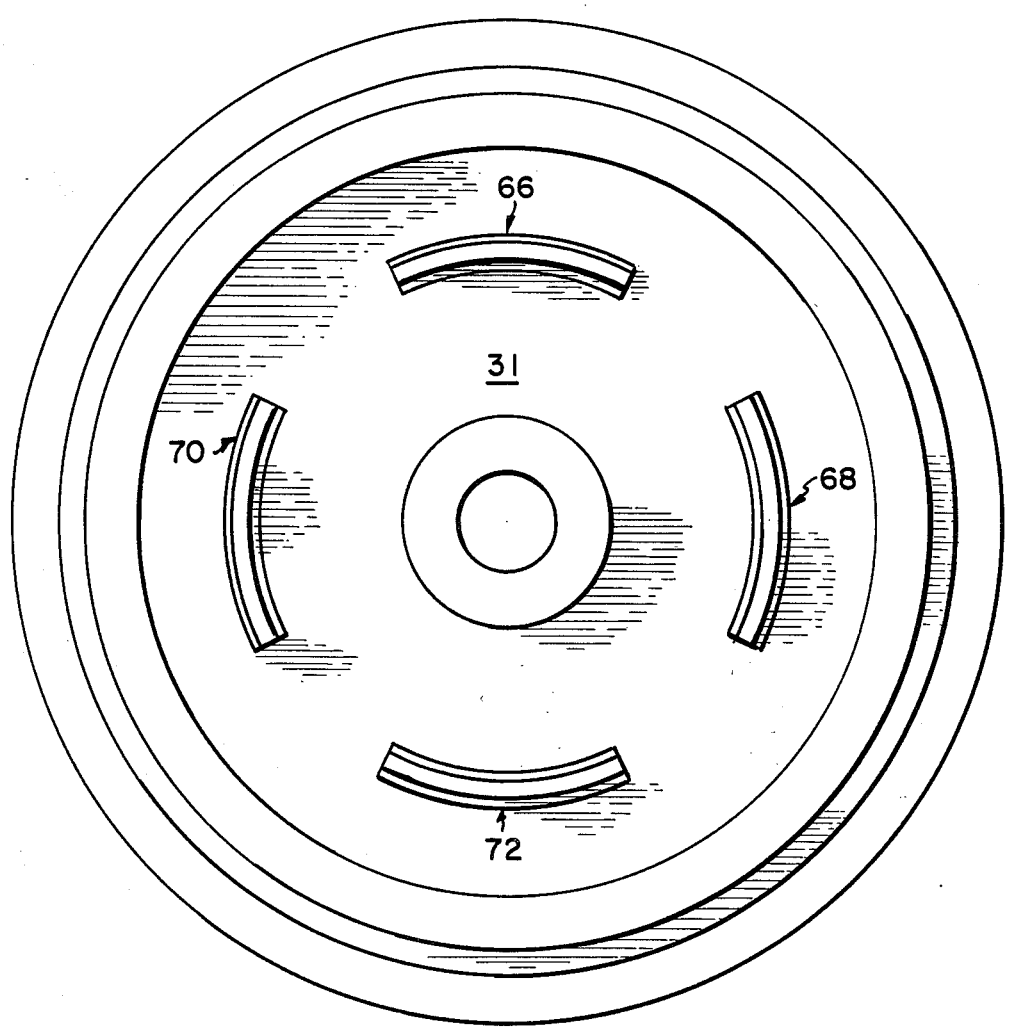
FIG. 6 is a bottom plan view of a cathode portion of an assembly in accordance with another embodiment of the present invention.

Referring to FIG. 6, a third embodiment of the present invention is depicted. This embodiment is similar to that of FIGS. 2 and 3 except that the member disposed in the cathode 31 comprises annular segments 66, 68, 70 and 72, rather than the continuous annular member 37 of FIG. 3. Accordingly, the recess in the target electrode 35 for receiving the annular segments 66, 68, 70 and 72 entails corresponding recesses shaped as annular segments. The operation of this embodiment is similar to that described above for the first embodiment.

Figure 7:
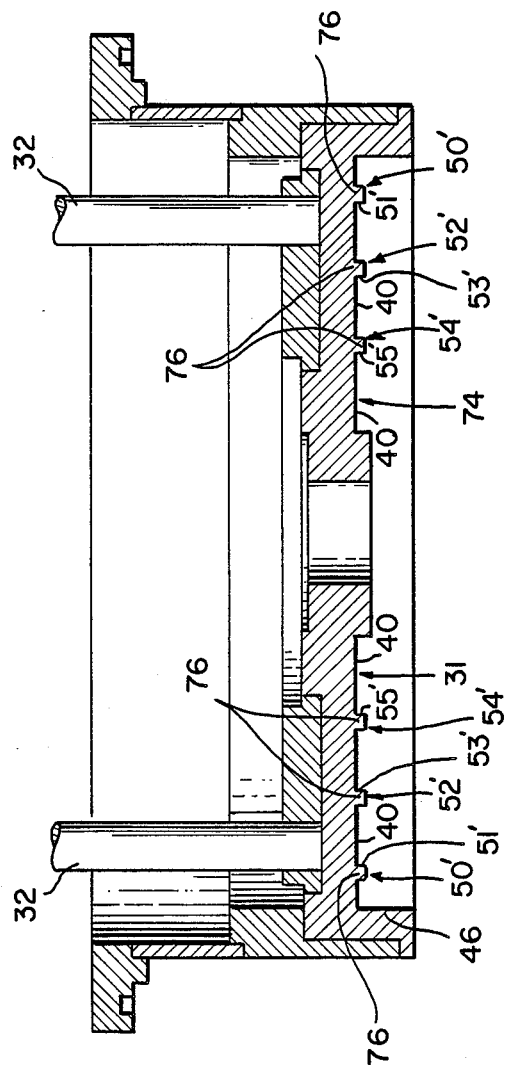
FIG. 7 is a sectional view of a cathode in accordance with another embodiment of the present invention.

Referring now to FIG. 7, there is disclosed a cathode 74 constructed in accordance with the preferred embodiment of the present invention. The annular members 50', 52', and 54' are each integrally formed from the cathode 74, as opposed to being an insert as previously described with respect to the embodiment of, for example, FIGS. 2 and 4. In this embodiment, the annular members 50', 52', and 54' each include a projecting portion or member 76 extending from surface 40 and having inner radial surfaces 51', 53', and 55'. The annular members 50', 52', and 54' although shown as having a rectangular cross-section, may be of other shapes, for example, triangular, trapezoidal, and the like. The operation of this embodiment is similar to that described above.

Figure 8:
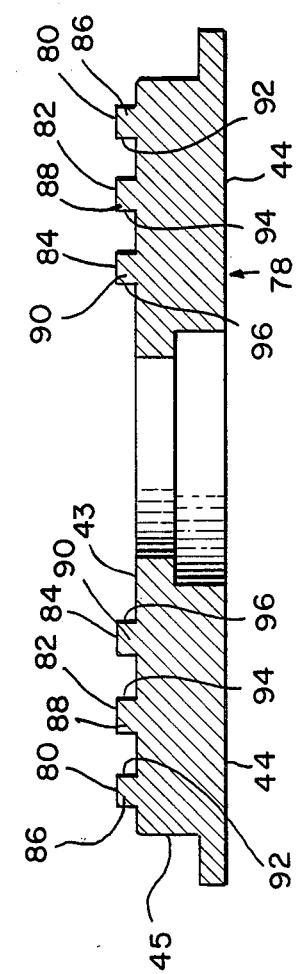
FIG. 8 is a sectional view of a target electrode in accordance with another embodiment of the present invention.

Referring now to FIG. 8, there is disclosed a target electrode 78 in accordance with still another embodiment of the present invention. In accordance with this embodiment, annular members 80, 82, and 84 are of the type described with respect to FIG. 7 by being integrally formed from the target electrode 78, each including a respective projecting portion or member 86, 88, and 90. Each of the projecting portions 86, 88, and 90 include a respective inwardly facing radial surface 92, 94, and 96. The target electrode 78 is mated within the hollow of a cathode (not shown) having corresponding annular recesses of the type as previously described. The operation of this embodiment is similar to that as described above.

The particular configuration, and positioning relative to the cathode and target electrode of the heat-reducing members described above may be varied to suit the needs of the occasion. The members need not be T-shaped or annular. For purposes of the present invention, it is sufficient that these members provide additional contact area with the target electrode, particularly at a location proximate to the cooling water, to efficiently dissipate heat. The present invention is designed to enhance the thermal coupling of the water-cooled cathode and the heated target electrode. Further, for purposes of the present invention it is preferable that these heat-reducing members be situated such that upon heating of the target electrode the electrode expands against these members. However, as indicated above, the particular configuration and placement of these members may be varied widely in accordance with these general principles of the present invention.

While the invention has been described in its preferred embodiments, it is to be understood that the words which have been used are words of description rather than limitation, and that changes within the purview of the appended claims may be made without departing from the true scope and spirit of the invention in its broader aspects.

What is claimed is:

1. An assembly for use in a deposition apparatus, comprising a source of material to be deposited having a surface, a cathode having a surface disposed in contact with the surface of said source, and coupling means comprising at least one annular member or segment thereof disposed between said cathode and said source, said annular member or segment thereof extending into a corresponding recessed region within one of said surfaces, said recessed region bound by a recessed wall surface arranged normal to said surface of said source and said cathode, said annular member or segment thereof having an upstanding wall surface extending into said recessed region and arranged parallel to said recessed wall surface, said upstanding wall surface engaging said recessed wall surface within said recessed region upon expansion of said source upon radial heating thereof for increasing the thermal coupling between said cathode and said source and for thermally securing said source to said cathode during the operation of said cathode.

2. The assembly of claim 1, wherein said coupling means includes a member projecting from said source, said cathode having said recessed region facing said source for receiving said member, said member and said recessed region being configured so that said member expands against said cathode upon heating of said source.

3. The assembly of claim 1, wherein said coupling means includes a member projecting from said cathode, said source having said recessed region facing said cathode for receiving said member, said member and said recessed region being configured so that said source expands against said member upon heating of said source.

4. The assembly of claim 3, wherein said coupling means comprises said annular member and said recessed region comprises a first annular recess.

5. The assembly of claim 4, wherein said annular member includes a base, said annular member being disposed substantially perpendicularly to said base.

6. The assembly of claim 5, wherein said cathode includes a second annular recess facing said first annular recess, said base being disposed in said second annular recess and said annular member being disposed in said first annular recess.

7. The assembly of claim 3, wherein said coupling means comprises a plurality of annular members concentrically arranged, and said recessed region comprising a corresponding first plurality of annular recesses each having one of said plurality of annular members disposed therein.

8. The assembly of claim 7, wherein said plurality of annular members each include a base, said annular members being disposed substantially perpendicular to a respective base.

9. The assembly of claim 8, wherein said cathode includes a second plurality of annular recesses, the bases of said plurality of annular members being disposed in, respectively, said second plurality of annular recesses and the remaining portion of said plurality of annular members being disposed in, respectively, said first plurality of annular recesses.

10. The assembly of claim 9, wherein said plurality of annular member are individually disposed within said source at preselected regions corresponding to locations of preselected values of power flux.

11. The assembly of claim 3, wherein said coupling means comprises said corresponding segment, and said recessed region comprises a recess configured as a segment of an annulus.

12. The assembly of claim 11, wherein said segment comprises a base and the remaining portion of said member being disposed substantially perpendicularly to said base, said cathode including a recess configured as a segment of an annulus, said base being disposed in said recess of said cathode, and said remaining portion of said member being disposed in said recess of said source.

13. The assembly of claim 1, wherein said coupling means is arranged at a preselected region corresponding to a location of a preselected value of power flux.

14. The assembly of claim 1, wherein said source comprises a target.

15. The assembly of claim 1, wherein said source includes a first planar surface portion, said cathode includes a second planar surface portion disposed against said first planar surface portion, and said annular member or segment thereof includes a member of rectangular cross-section projecting away from one of said surface portions.

16. The assembly of claim 15, wherein said recessed region is of corresponding rectangular cross-section extending within another of said surface portions for releasably receiving said member so as to maintain said first and second planar surface portions disposed against each other.

17. The assembly of claim 16, wherein said upstanding wall surface is arranged transverse to said first and second planar surface portions, said recessed region defined by at least one of said recessed wall surface arranged transverse to said first and second planar surface portions, whereby the radial expansion of said source causing engagement of said upstanding wall surface of said member with said recessed wall surface of said recessed region for increasing the thermal coupling between said source and said electrode.

18. The assembly of claim 17, wherein the radial expansion of said source causes engagement of said upstanding wall surface of said member with said recessed wall surface of said recessed region from a location adjacent said first and second planar surface portions to the free end of said member for increasing the thermal coupling between said source and said cathode.

19. A deposition apparatus comprising a source of material to be deposited having a surface a cathode having a surface disposed in contact with the surface of said source, coupling means comprising at least one annular member or segment thereof disposed between said cathode and said source, said annular member or segment thereof extending into a corresponding recessed region within one of said surfaces, said recessed region bound by a recessed wall surface arranged normal to said surfaces of said source and said cathode, said annular member or segment thereof having an upstanding wall surface extending into said recessed region and arranged parallel to said recessed wall surface, said upstanding wall surface engaging said recessed wall surface within said recessed region upon radial expansion of said source upon heating thereof for increasing the thermal coupling between said cathode and said source and for thermally securing said source to said cathode during the operation of said cathode, means coupled to said source for removal of material to be deposited, mounting means for mounting a workpiece for receiving a layer of said material, and a housing for receiving said source, said cathode, said coupling means and said mounting means.

20. The deposition apparatus of claim 19, wherein said coupling means includes a member projecting from said source, said cathode having said recessed region facing said source for receiving said member, said member and said recessed region being configured so that said member expands against said cathode upon heating of said source.

21. The deposition apparatus of claim 19, wherein said coupling means includes a member projecting from said cathode, said source having said recessed region facing said cathode for receiving said member, said member and said recessed region being configured so that said source expands against said member upon heating of said source.

22. The deposition apparatus of claim 21, wherein said coupling means comprises said annular member and said recessed region comprises a first annular recess.

23. The deposition apparatus of claim 22, wherein said annular member includes a base, said annular member being disposed substantially perpendicularly to said base.

24. The deposition apparatus of claim 23, wherein said cathode includes a second annular recess facing said first annular recess, said base being disposed in said second annular recess and said annular member being disposed in said first annular recess.

25. The deposition apparatus of claim 21, wherein said coupling means comprises a plurality of annular members concentrically arranged, and said recessed region comprising a corresponding first plurality of annular recesses each having one of said plurality of annular members disposed therein.

26. The deposition apparatus of claim 25, wherein said plurality of annular members each include a base, said annular members being disposed substantially perpendicularly to a respective base.

27. The deposition apparatus of claim 26, wherein said cathode includes a second plurality of annular recesses, the bases of said plurality of annular members being disposed in, respectively, said second plurality of annular recesses, and the remaining portion of said plurality of annular members being disposed in, respectively, said first plurality of annular recesses.

28. The deposition apparatus of claim 27, wherein said plurality of annular members are individually disposed within said source at preselected regions corresponding to locations of preselected values of power flux.

29. The deposition apparatus of claim 21, wherein said coupling means comprises said segment, and said recessed region comprises a recess configured as a corresponding segment of an annulus.

30. The deposition apparatus of claim 29, wherein said segment comprises a base and the remaining portion of said member being disposed substantially perpendicularly to said base, said cathode including a recess configured as a segment of an annulus, said base being disposed in said recess of said cathode, and said remaining portion of said member being disposed in said recess of said source.

31. The deposition apparatus of claim 19, wherein said coupling means is arranged at a preselected region corresponding to a location of a preselected value of power flux.

32. The deposition apparatus of claim 19, wherein said source comprises a target.

33. The deposition apparatus of claim 19, wherein said source includes a first planar surface portion, said cathode includes a second planar surface portion disposed against said first planar surface portion, and said annular member or segment thereof includes a member of rectangular cross-section projecting away from one of said surface portions.

34. The deposition apparatus of claim 33, wherein said recessed region is of corresponding rectangular crosssection extending within another of said surface portions for releasably receiving said member so as to maintain said first and second planar surface portions disposed against each other.

35. The deposition apparatus of claim 34, wherein said upstanding wall surface is arranged transverse to said first and second planar surface portions, said recessed region defined by at least one of said recessed wall surface arranged transverse to said first and second planar surface portions, whereby the radial expansion of said source causing engagement of said upstanding wall surface of said member with said recessed wall surface of said recessed region for increasing the thermal coupling between said source and said cathode.

36. The deposition apparatus of claim 35, wherein the radial expansion of said source causes engagement of said upstanding wall surface of said member with said recessed wall surface of said recessed region from a location adjacent said first and second planar surface portions to the free end of said member for increasing the thermal coupling between said source and said cathode.

* * * * *

UNITED STATES PATENT AND TRADEMARK OFFICE
CERTIFICATE OF CORRECTION

PATENT NO. : 4,885,075

DATED : December 5, 1989

INVENTOR(S) : Gary Hillman

It is certified that error appears in the above-identified patent and that said Letters Patent is hereby corrected as shown below:

Column 8, lines 10-11, delete "said coupling means comprises said corresponding segment, and".

Signed and Sealed this

Eighteenth Day of December, 1990

Attest:

HARRY F. MANBECK, JR.

*Attesting Officer*  *Commissioner of Patents and Trademarks*